US007659544B2

(12) United States Patent
Lu et al.

(10) Patent No.: US 7,659,544 B2
(45) Date of Patent: Feb. 9, 2010

(54) LIGHT EMITTING DEVICE WITH AT LEAST TWO ALTERNATELY DRIVEN LIGHT EMITTING DIODES

(75) Inventors: Ming Lu, Sijhih (TW); Lap-Wei Leung, Hong Kong (CN); Geoffrey Wen Tai Shuy, New Territories (CN)

(73) Assignee: Hong Kong Applied Science and Technology Research Institute Co., Ltd., Hong Kong SAR (CN)

( * ) Notice: Subject to any disclaimer, the term of this patent is extended or adjusted under 35 U.S.C. 154(b) by 463 days.

(21) Appl. No.: 11/317,937

(22) Filed: Dec. 23, 2005

(65) Prior Publication Data

US 2007/0145349 A1 Jun. 28, 2007

(51) Int. Cl.
*H01L 29/18* (2006.01)
*H01L 33/00* (2006.01)
*H01L 29/20* (2006.01)
*H01L 29/22* (2006.01)
*H01L 29/227* (2006.01)

(52) U.S. Cl. ............................ 257/88; 257/89; 257/98; 257/99; 257/E31.099; 257/E31.105; 257/E33.001

(58) Field of Classification Search ............. 257/88–89, 257/98–99, E31.099, E31.105, E33.001
See application file for complete search history.

(56) References Cited

U.S. PATENT DOCUMENTS 4,271,408 A * 6/1981 Teshima et al. ............... 345/83
4,870,325 A 9/1989 Kazar
4,887,074 A 12/1989 Simon et al.
5,771,250 A * 6/1998 Shigehara et al. .............. 372/6
5,998,925 A 12/1999 Shimizu et al.
6,445,007 B1 9/2002 Wu et al.
6,501,102 B2 12/2002 Mueller-Mach et al.
6,563,139 B2 5/2003 Hen
6,642,652 B2 11/2003 Collins, III et al.
6,686,691 B1 2/2004 Mueller et al.

(Continued)

FOREIGN PATENT DOCUMENTS

CN 86202512 U 1/1986

(Continued)

OTHER PUBLICATIONS

Craford, M. George, Holonyak, Nick, and Kish, Frederiek, "In Pursuit of the Ultimate Lamp", Scientific American 284, 62, Feb. 2001.

(Continued)

*Primary Examiner*—Ida M Soward
(74) *Attorney, Agent, or Firm*—Schlee IP International P.C.; Alexander R. Schlee

(57) ABSTRACT

A light emitting device includes a first light emitting diode (LED) emitting a first light emission of at least a first wavelength, and a second light emitting diode emitting a second light emission of at least a second wavelength. The second LED is placed in close proximity to the first LED such that after a mixing length from the first and second LEDs, a combination of the first and second lights is perceived as one color in the human vision. In use, the first and second LEDs are alternately driven by a power source in the time domain.

26 Claims, 9 Drawing Sheets

U.S. PATENT DOCUMENTS

| | | | | |
|---|---|---|---|---|
| 6,801,146 | B2 * | 10/2004 | Kernahan et al. | 341/122 |
| 6,812,500 | B2 | 11/2004 | Reeh et al. | |
| 6,963,085 | B2 * | 11/2005 | Chou | 257/88 |
| 7,005,803 | B2 * | 2/2006 | Abiko | 315/56 |
| 7,106,010 | B2 | 9/2006 | Liao et al. | |
| 7,180,487 | B2 | 2/2007 | Kamikawa et al. | |
| 7,230,222 | B2 * | 6/2007 | Cheng et al. | 250/205 |
| 7,293,907 | B2 * | 11/2007 | Kim et al. | 362/612 |
| 7,381,995 | B2 * | 6/2008 | Tain et al. | 257/82 |
| 7,385,653 | B2 * | 6/2008 | Kim et al. | 349/61 |
| 2003/0076057 | A1 | 4/2003 | Fleury | |
| 2004/0065893 | A1 | 4/2004 | Otsuka et al. | |
| 2004/0262614 | A1 * | 12/2004 | Hack et al. | 257/79 |
| 2005/0040427 | A1 * | 2/2005 | Sugawara et al. | 257/103 |
| 2006/0065989 | A1 * | 3/2006 | Druffel et al. | 264/1.32 |
| 2007/0258240 | A1 * | 11/2007 | Ducharme et al. | 362/231 |

FOREIGN PATENT DOCUMENTS

| | | | |
|---|---|---|---|
| CN | 2454905 | Y | 10/2001 |
| CN | 1355936 | A | 6/2002 |
| CN | 1832645 | A | 9/2006 |
| JP | 61-182276 | A | 8/1986 |

OTHER PUBLICATIONS

Office Action issued by the United States Patent and Trademark Office for U.S. Appl. No. 11/317,281 dated Oct. 19, 2007.

Office Action issued by the United States Patent and Trademark Office for U.S. Appl. No. 11/317,281 dated May 28, 2008.

Office Action issued by the United States Patent and Trademark Office for U.S. Appl. No. 11/318,314 dated Feb. 21, 2008.

* cited by examiner

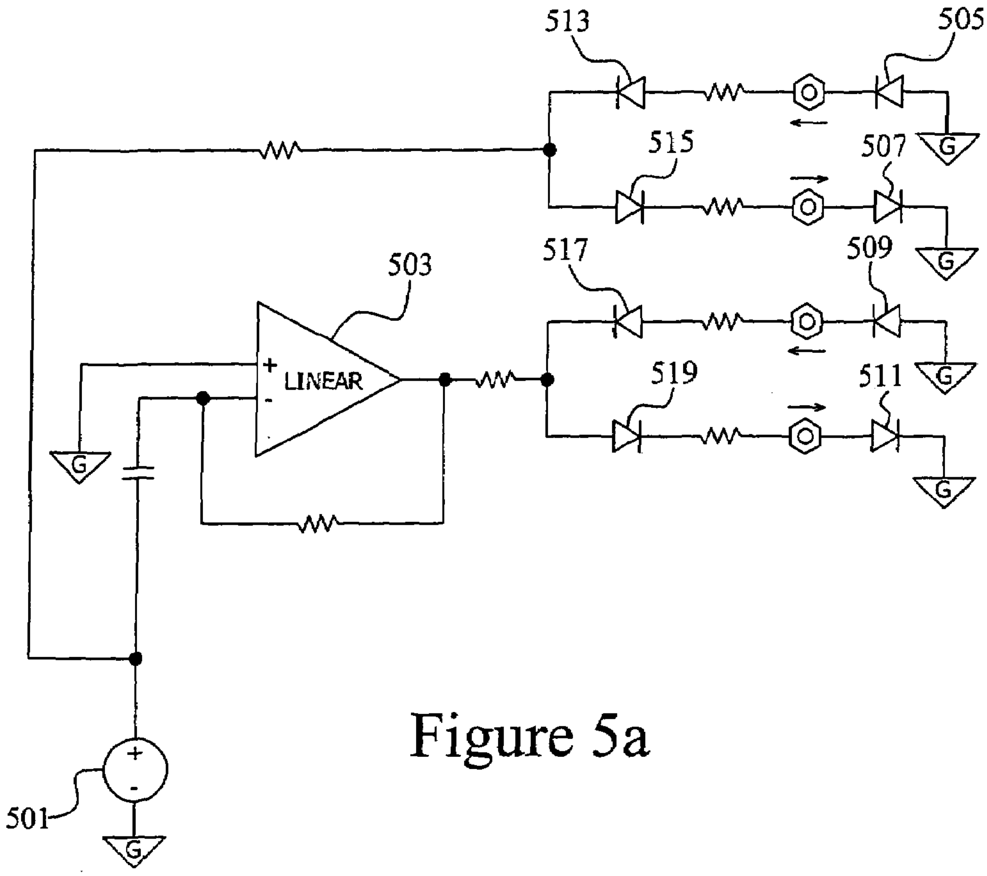
Figure 5a
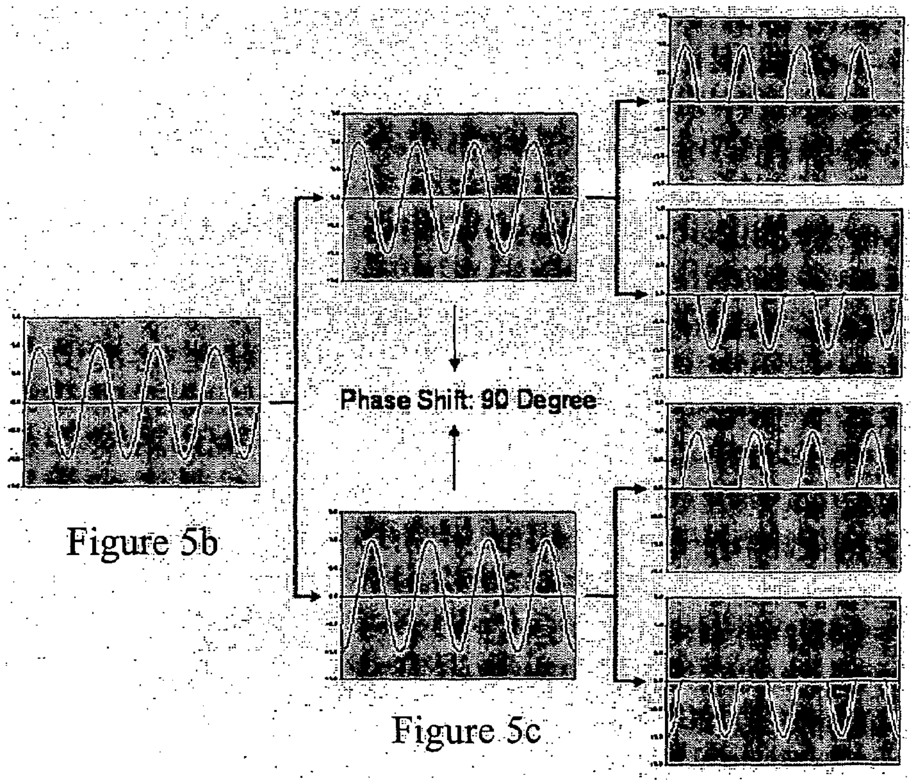
Figure 5b
Figure 5c
Figure 5d

LIGHT EMITTING DEVICE WITH AT LEAST TWO ALTERNATELY DRIVEN LIGHT EMITTING DIODES

BACKGROUND

1. Field of the Invention

The present application relates to light emitting devices using light emitting diode(s) to generate lights of desired color(s).

2. Background of the Invention

With the development of efficient LED devices that emit bluish or ultraviolet (UV) light, it has become feasible to produce LED devices that generate white light through phosphor conversion of a portion of the primary radiation emission of the light emitting structure of the LED device to longer wavelengths. Conversion of primary emission to longer wavelengths is commonly referred to as down-conversion of the primary emission. An unconverted portion of the primary emission combines with the light of longer wavelength to produce white light. LED devices that produce white light through phosphor conversion are useful for signaling and illumination purposes.

Recent developments have been focused on the phosphor materials to improve the production of white lights by using LED devices. See, for example, U.S. Pat. No. 5,998,925 entitled "Light emitting device having a nitride compound semiconductor and a phosphor containing a garnet fluorescent material" filed by Shimizu et al on Jul. 29, 1997; U.S. Pat. No. 6,501,102 entitled "Light emitting diode (LED) device that produces white light by performing phosphor conversion on all of the primary radiation emitted by the light emitting structure of the LED device" filed by Mueller-Mach et al on Aug. 28, 2001; U.S. Pat. No. 6,642,652 entitled "Phosphor-converted light emitting device" filed by Collins, III et al on Jun. 11, 2001; U.S. Pat. No. 6,686,691 entitled "Tri-color, white light LED lamps" filed by Mueller et al on Sep. 27, 1999; U.S. Pat. No. 6,812,500 entitled "Light-radiating semiconductor component with a luminescence conversion element" filed by Reeh et al on Dec. 6, 2000.

However, as stated in the SCIENTIFIC AMERICAN article, titled "In Pursuit of the Ultimate Lamp", published in the February 2001 issue, the use of phosphor material in the production of white light is "inherently less efficient, because energy is lost in converting ultraviolet or blue light into lower-energy light (that is, light toward the red end of the spectrum). Moreover, light is also lost because of scattering and absorption in the phosphor packaging." (Page 67).

There have been few discussions about reduction of energy consumptions in the production of white color light. The conventional use of phosphors in the production of white color light may even result in higher energy consumption.

OBJECT OF THE INVENTION

Therefore, it is an object of the present invention to provide a light emitting device with improved energy consumption characters, or at least provide the public with a useful choice.

SUMMARY OF THE INVENTION

According to an aspect of the present invention, a light emitting device includes a first light emitting diode (LED) emitting a first light emission of at least a first wavelength, and a second light emitting diode emitting a second light emission of at least a second wavelength. The second LED is placed in close proximity to the first LED such that after a mixing length from the first and second LEDs, a combination of the first and second lights is perceived as one color in the human vision. In use, the first and second LEDs are alternately driven by a power source in the time domain.

In one embodiment the power source repeatedly and sequentially drives the first LED and the second LED.

In another embodiment the power source is an alternate current power source.

In one embodiment there is a rectifying circuit between the power source and at least one of the first LED and the second LED.

In one embodiment the herein the first LED and the second LED are electrically connected in parallel.

In another embodiment the power source outputs a plurality of periodic discontinuous pulses for alternately driving the first LED and the second LED.

In another embodiment the pulses includes a first and a second set of pulses each set being of a first and second number of pulses within a predetermined period of time, and wherein the color perceived in the human vision can be determined and controlled by controlling a ratio of the first number to the second number.

In another embodiment the pulses includes a first and a second set of pulses, and wherein the color perceived in the human vision can be determined and controlled by controlling a ratio of the pulse width of the first set to the pulse width of the second set.

In another embodiment the output of the power source drives at least one of the first LED and the second LED at a frequency of at least 20 Hz.

In another embodiment there is a control mechanism for controlling at least a character of one of first LED and the second LED for altering the color perceived in the human vision. The control mechanism may include an adjustable resistor for controlling the voltage amplitude applied to the at least one of the first and second LEDs, and/or means for controlling the frequency of the power signals applied to at least one of the LEDs.

In another embodiment the first and second wavelengths are different.

In another embodiment the first and second wavelengths are the same, the device has a phosphor materials coating at least one of the first and second LEDs for generating a light of different wavelength.

In another embodiment there is a diffuser for diffusing at least one of the first and second lights so as to reduce the mixing length.

In another embodiment there time delay mechanism in electrical connection with the power source for delaying the power signal by a predetermined period of time so as to drive at least a third LED. The time delay mechanism may optionally include a phase shifter for shifting the phase of the power signal by a predetermined amount.

In another embodiment the first and second LEDs are stacked for reducing the mixing length, either by using flip-chip technology, a wire bonding process, or other means.

In another embodiment the first and second LEDs are firstly adhered by using epoxy materials.

In another embodiment at least one of the first and second LEDs is coated with a phosphor of a different color for reducing the mixing length.

In one embodiment the light transmitters generate the respective optical signals in a temporally staggered manner.

In another embodiment, there is a light emitting device with a first light emitting diode (LED) emitting blue light, a second light emitting diode emitting amber light, the second light emitting diode is placed in close proximity to the first light emitting diode such that the combination of the blue and amber light form white light as perceived by the human vision; and a power source for alternating driving the first LED and the second LED in the time domain.

In another embodiment the one color perceived in the human vision is any desired color in the color spectrum.

In another embodiment the one color perceived in the human vision is the color white.

In another embodiment the first LED emitting a first light of a first wavelength is one of a first plurality of LEDs emitting a first light of a first wavelength; the second LED emitting a second light of a second wavelength is one of a second plurality of LEDs emitting a second light of a second wavelength; there being no other LED other than the first and second plurality of LEDs involved in generating the one color perceived in the human vision.

According to another aspect of the present invention, a light emitting device includes

- a first light emitting diode (LED) emitting blue light;
- a second light emitting diode emitting amber light, the second light emitting diode being placed in close proximity to the first light emitting diode such that the combination of the blue and amber light form white light; and
- a power source for alternately driving the first LED and the second LED in the time domain.

Other aspects and advantages of the invention will become apparent from the following detailed description, taken in conjunction with the accompanying drawings, which description illustrates by way of example the principles of the invention. Other features which are also considered as characteristic for the invention are set forth in the appended claims.

BRIEF DESCRIPTION OF THE DRAWINGS

FIG. 5*a* is a simplified electrical diagram of another exemplary light emitting device embodiment;

FIGS. 5*b-d* illustrates the electrical signals applied to the different parts of the light emitting device of FIG. 5*a;*

DETAILED DESCRIPTION

Figure 1A:
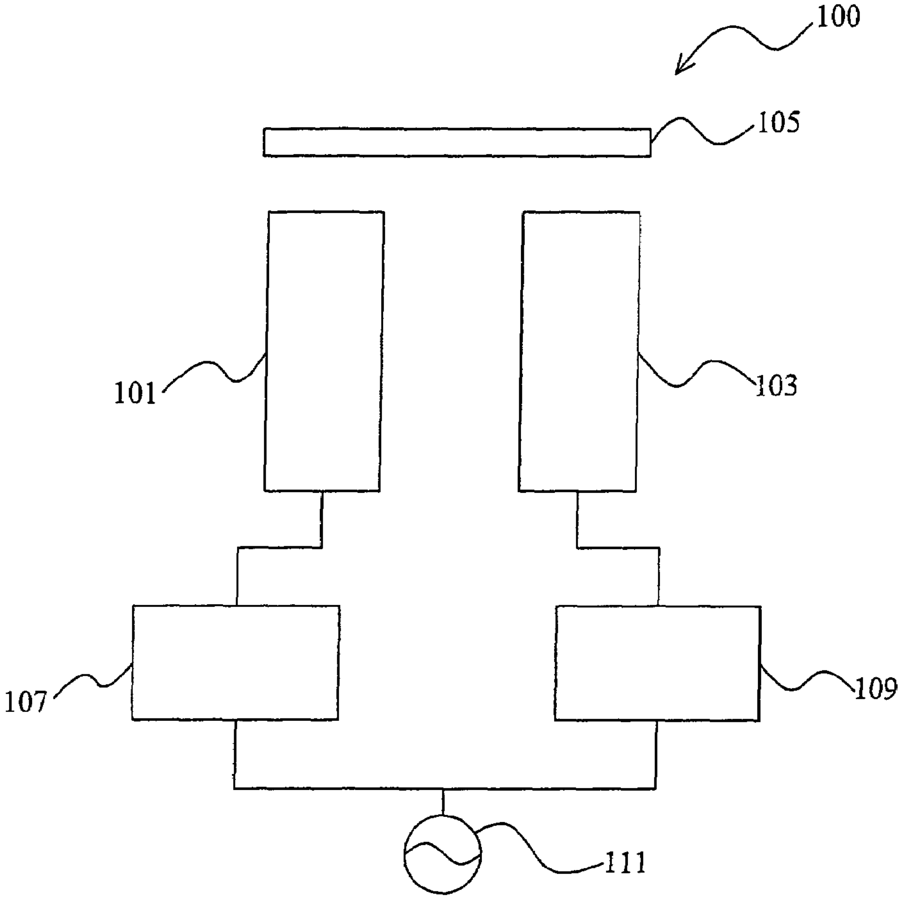
FIG. 1*a* illustrates the structure of an exemplary light emitting device according to an embodiment of the invention.

FIG. 1*a* illustrate an exemplary light emitting device embodiment 100 of the present invention. The light emitting device 100 has a pair of light emitting diodes (LED) 101, 103 emitting blue and amber light emissions respectively. The LEDs 101, 103 are placed in close proximity such that the blue and amber light emissions combine to produce a light of a different color, preferably but not limited to white light, in the human vision after a mixing length from the LEDs. A diffuser 105 can be placed on the light path of the lights from the LEDs for reducing the mixing length.

An alternating current power source 111, connected to the LEDs 101, 103 via a pair of driving circuit 107, 109 respectively, alternately drives the blue and amber LEDs 101, 103 such that in the time domain, each LED 101, 103 alternately emits light emissions. Due to the persistence of vision, when the frequency of the AC power signals is sufficiently high, for example, higher than 25 Hz, the discontinuoucy in the blue light or amber light may becomes innoticeable in the human vision.

Figure 1B:
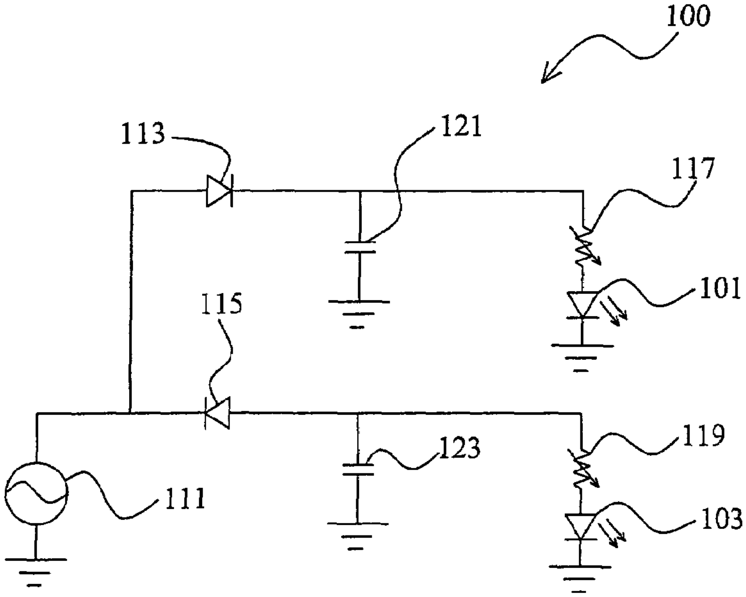
FIG. 1*b* is a simplified electrical diagram of an implementation of the light emitting device of FIG. 1*a;*

FIG. 1*b* illustrates a simplified electrical circuit for an exemplary implementation of FIG. 1*a*. The blue and amber LEDs 101, 103 are connected in parallel to power source 111, each respectively via a diode 113, 115 for rectification and an adjustable resistor 117, 119 for controlling and/or altering the amplitude of the current supplied to the LEDs 101, 103. Capacitors 121, 123 between the rectifying diode 113, 115 and ground can be used for filtering purpose.

Figure 1C:
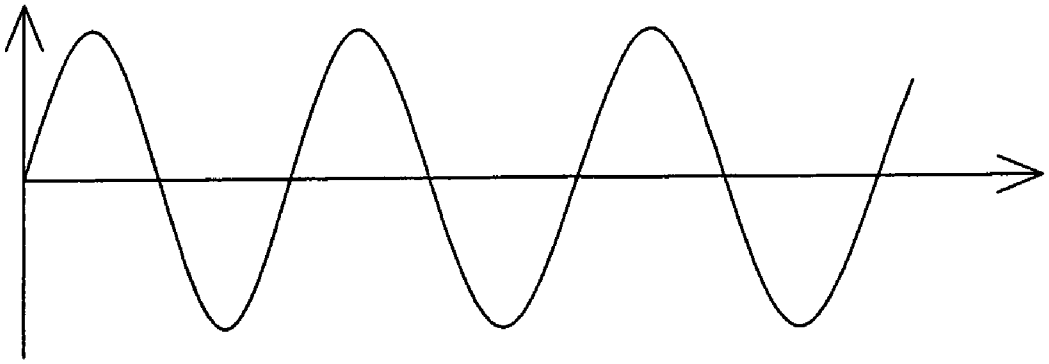
FIG. 1*c* illustrates the output of the power source useful in the light emitting device of FIGS. 1*a* and 1*b;*
Figure 1D:
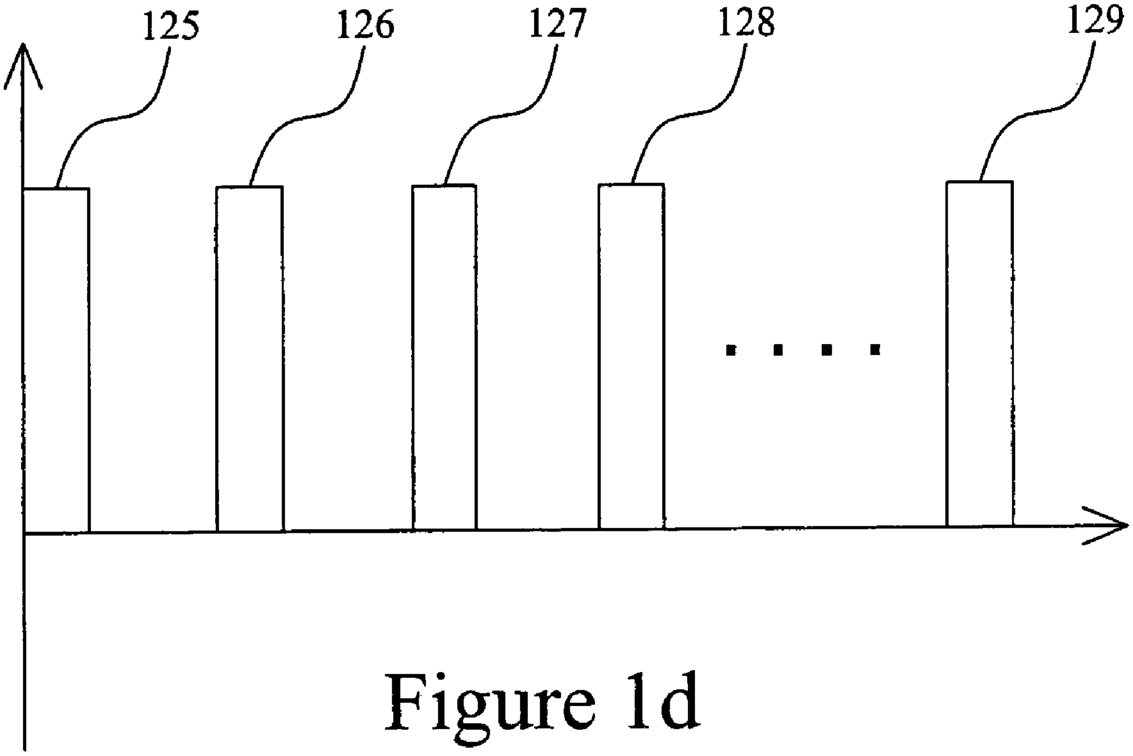
FIG. 1*d* illustrates a different type of output of the power source useful in the light emitting device of FIG. 1*a;*

The output of an exemplified alternating power source 111 is illustrated in FIG. 1*c*. FIG. 1*d* illustrates a different type of output of the power source useful in the light emitting device of FIG. 1*a*, having a plurality of periodic discontinuous pulses 125-129 for alternately driving the blue and amber LEDs 101, 103. The pulses 125-129 can be divided into a first set 125, 127 . . . and a second set 126, 128 . . . , each set being of a first and second number of pulses within a predetermined period of time, and the color of the output combination of lights can be controlled by controlling a ratio of the first number to the second number as could be understood in the art. In addition, the color of the output combination of lights exhibited in the human vision can be controlled by controlling a ratio of the pulse width of the first set to the pulse width of the second set. Control of the light can be determined in accordance with the CIE color chart as illustrated in FIG. 5.

Figure 2A:
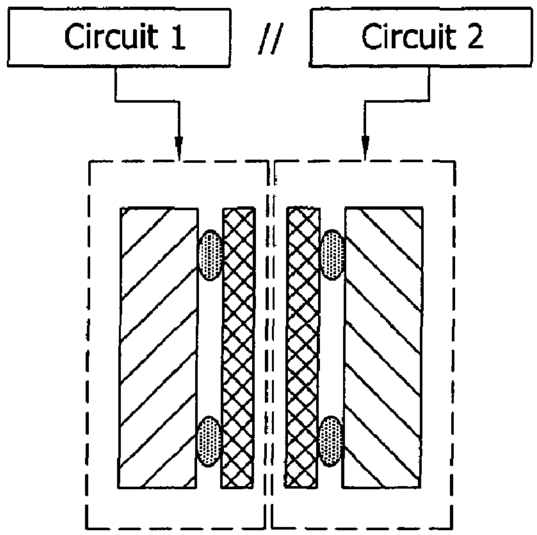
FIGS. 2*a-d* each at least partially illustrates the structure of an exemplary light emitting device according to a second embodiment of the invention.
Figure 2B:
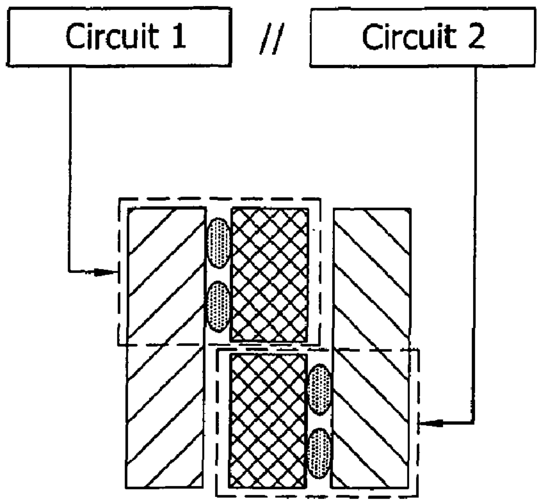
Figure 2C:
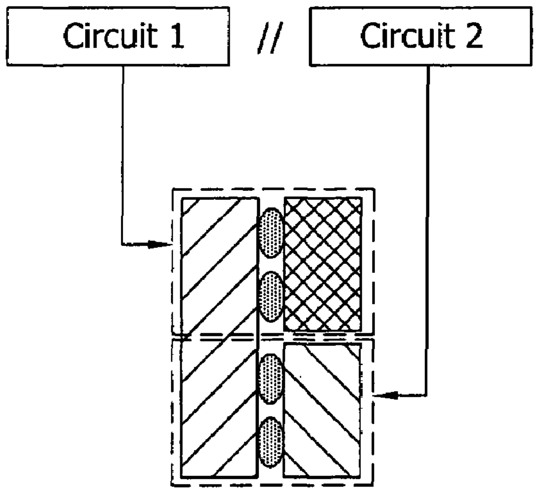
Figure 2D:
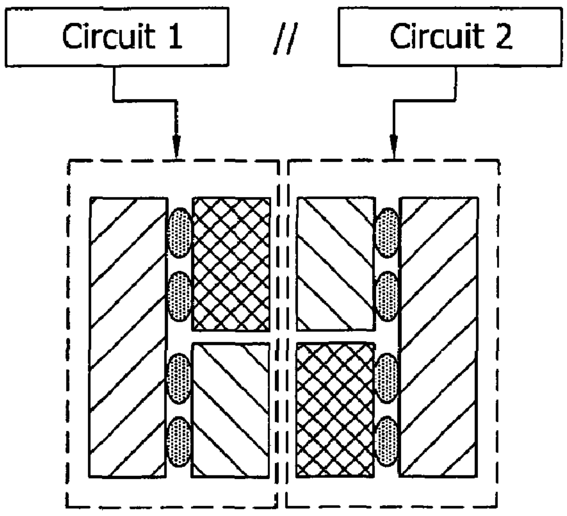
Figure 2E:
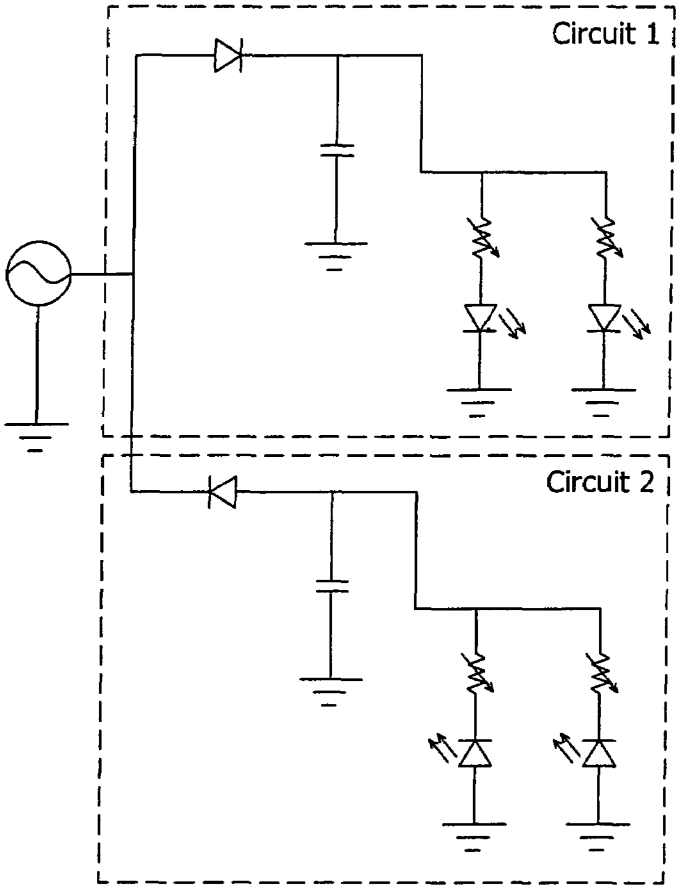
FIG. 2*e* a simplified electrical diagram suitable for implementing the light emitting device of FIGS. 2*a-d;*

More than one LEDs can be used to form a light emitting device so as to produce mixed lights of various colors. As shown in FIGS. 2*a-d*, each of which at least partially illustrates the exemplary structure of such a light emitting device, the LEDs can be connected in parallel and/or series and then driven by a reduced number of driving circuits. This may simplify the electrical design as shown by FIG. 2*e*, which uses a pair of driving circuits to alternately drive four LEDs divided into two pairs connected in parallel. In addition, it could be understood that the LEDs can be of different wavelengths.

Figure 3A:
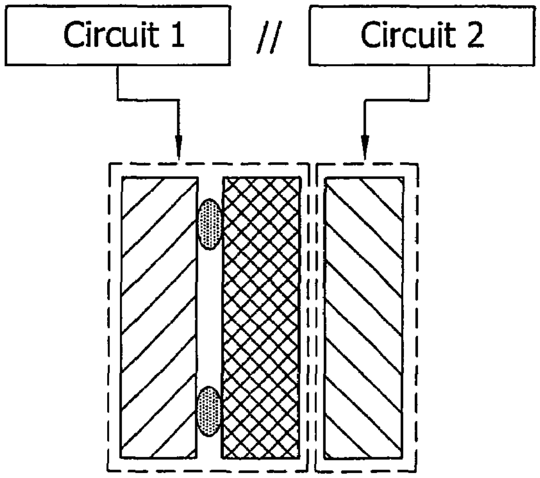
FIG. 3*a* illustrates the structure of an exemplary light emitting device according to a third embodiment of the invention.
Figure 3B:
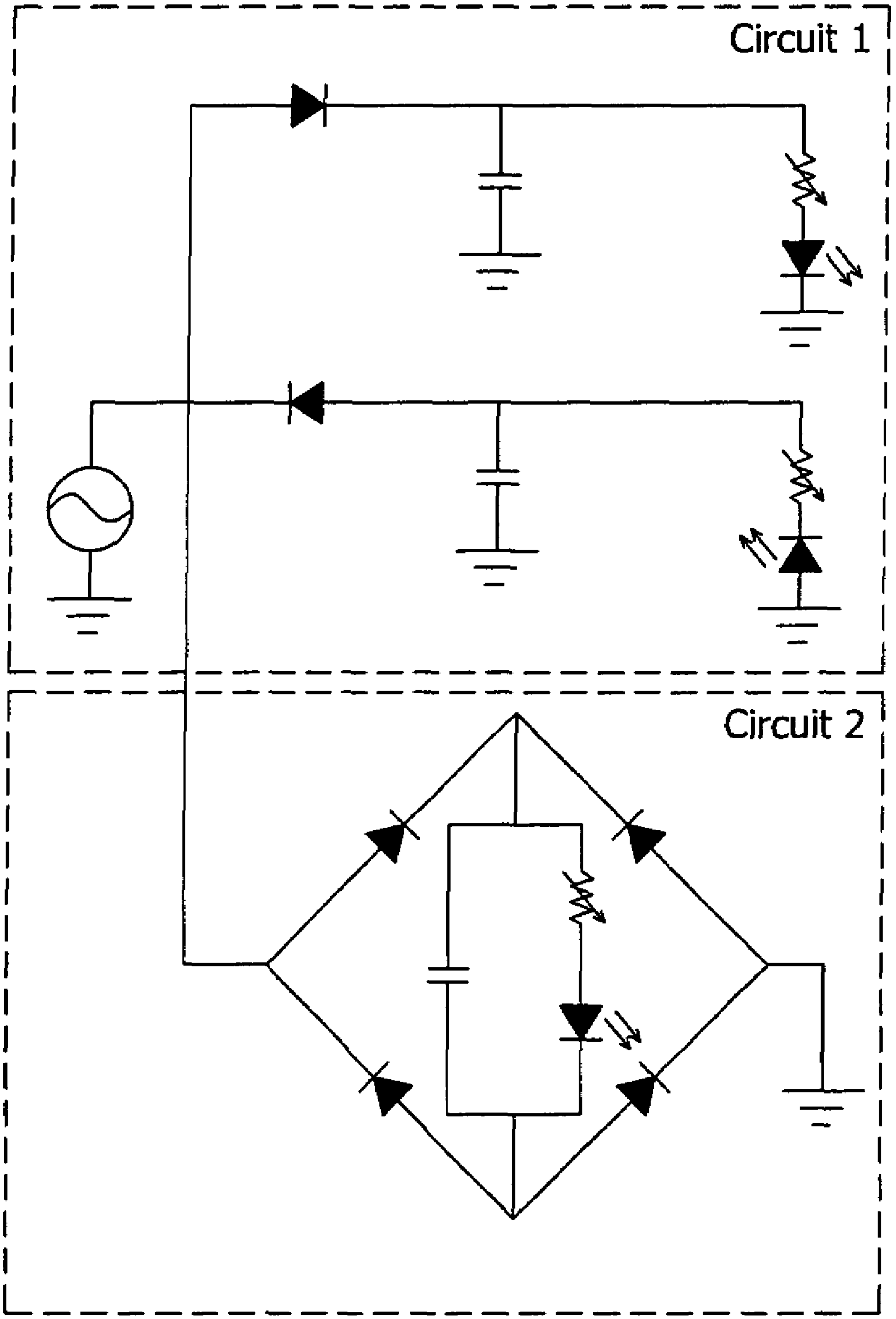
FIG. 3*b* is a simplified electrical diagram of the light emitting device of FIG. 3*a;*
Figure 4A:
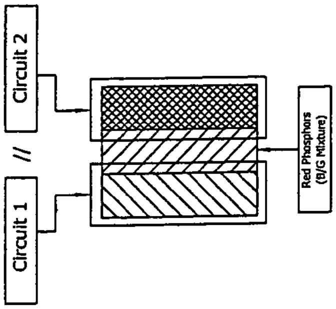
FIGS. 4*a-j* each illustrates the structure of an exemplary light emitting device according to a fourth embodiment of the invention.
Figure 4B:
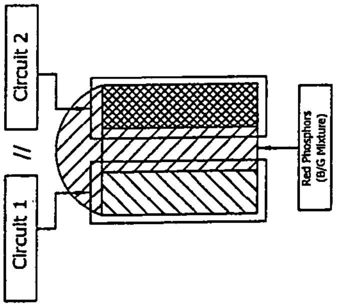
Figure 4C:
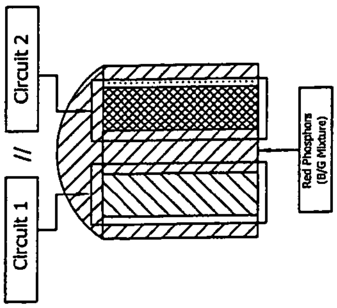
Figure 4D:
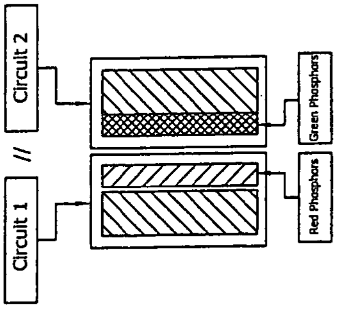
Figure 4E:
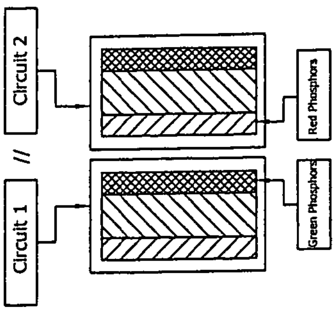
Figure 4F:
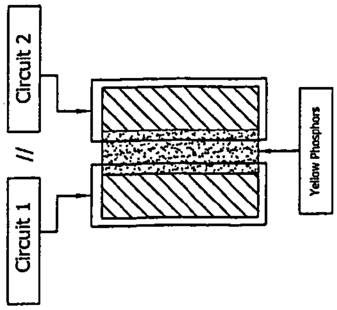
Figure 4G:
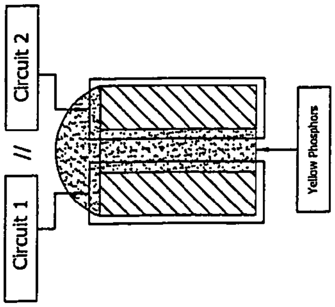
Figure 4H:
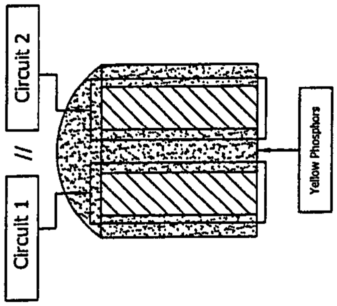
Figure 4I:
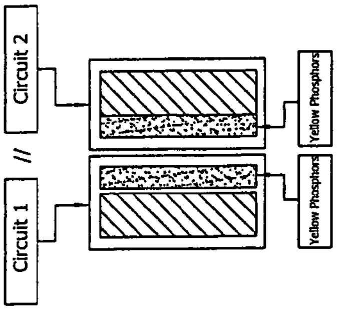
Figure 4J:
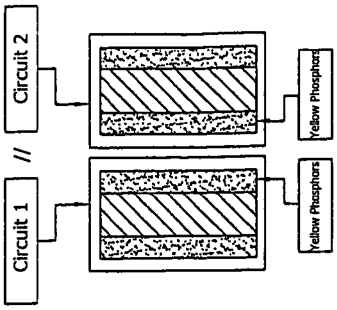
Figure 4K:
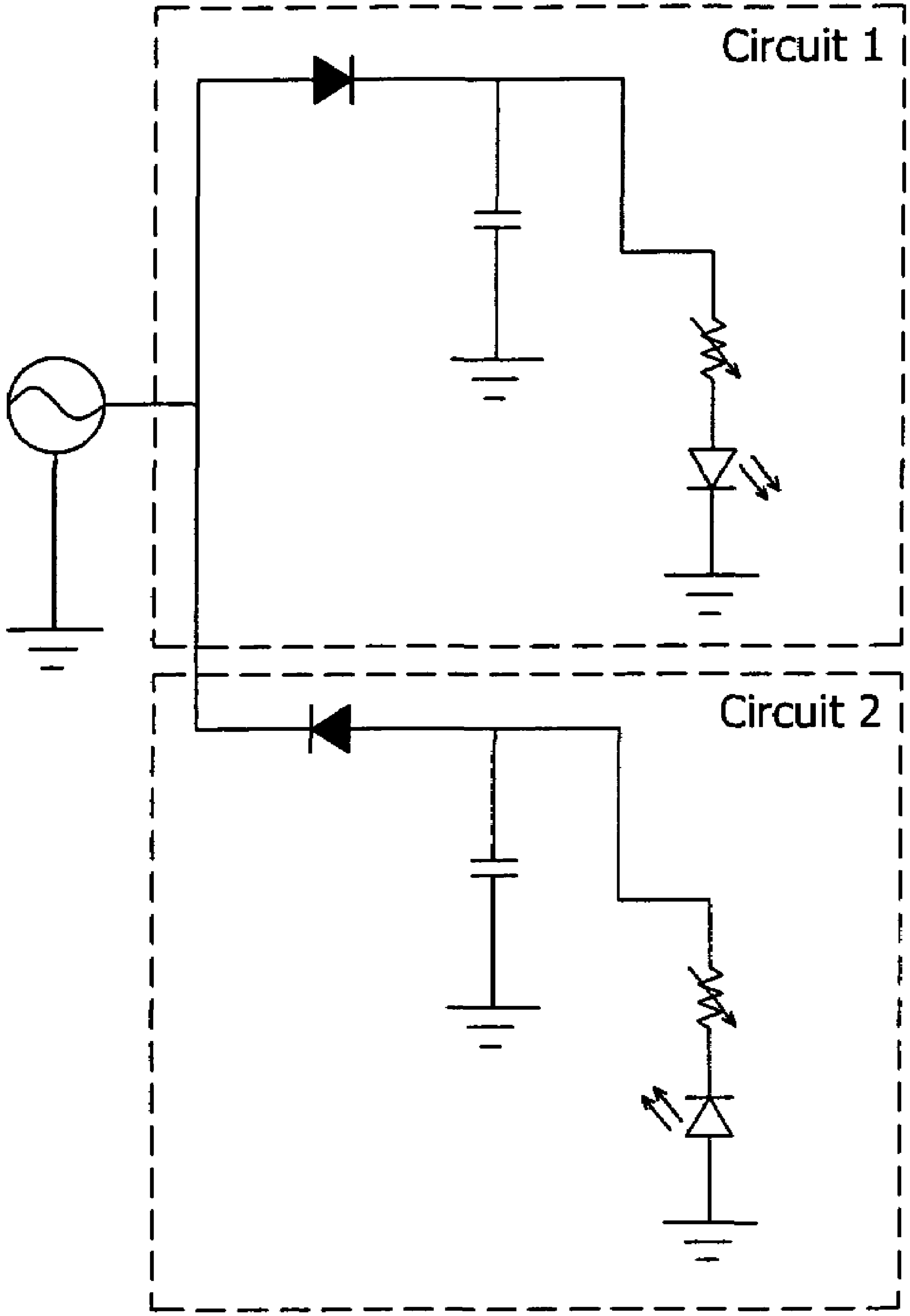
FIG. 4*k* a simplified electrical diagram of the light emitting device of FIGS. 4*a-j;*

FIGS. 3*a* and 3*b* illustrate another exemplary embodiment, which uses two half wave rectifiers for driving two LEDs respectively and a full-wave bridge rectifier for driving a third LED. In this way, alternate driving of the LEDs can be achieved.

FIGS. 4*a*-4*j* illustrate further exemplary embodiments of the present inventions. In these embodiments, the LEDs can be of the same wavelength but the LEDs are coated with phosphors of a different color so that lights of different wavelengths can be generated due to down conversion by the phosphors. Similarly to the above-discussed embodiments, the LEDs are driven alternately so that lower energy consumption can be achieved. In addition, control of the color of the output lights can be achieved by using different types of phosphors or different modulation ways as descried above, which could be understood in the art.

Figure 5E:
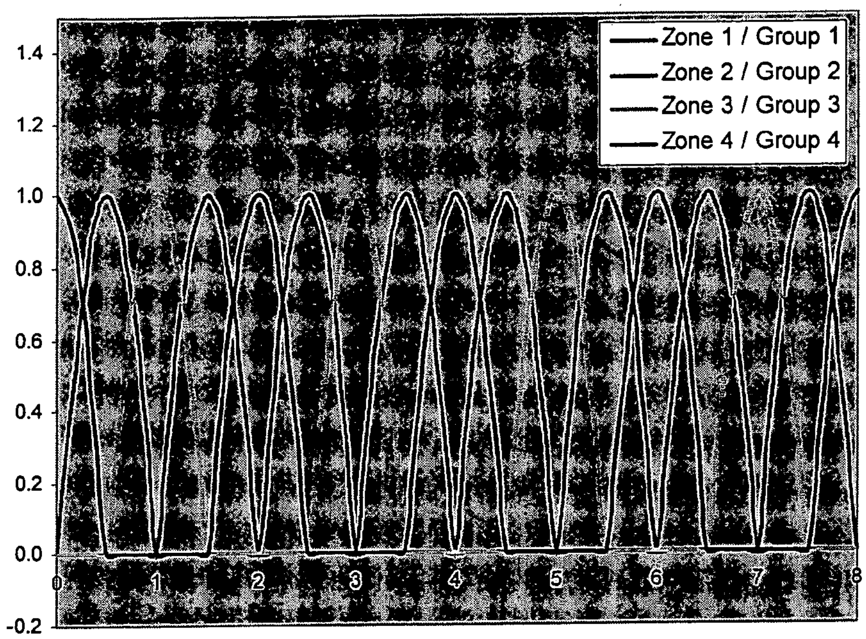
FIG. 5*e* illustrates the driving of the LEDs of the light emitting device of FIG. 5*a*.
Figure 6:
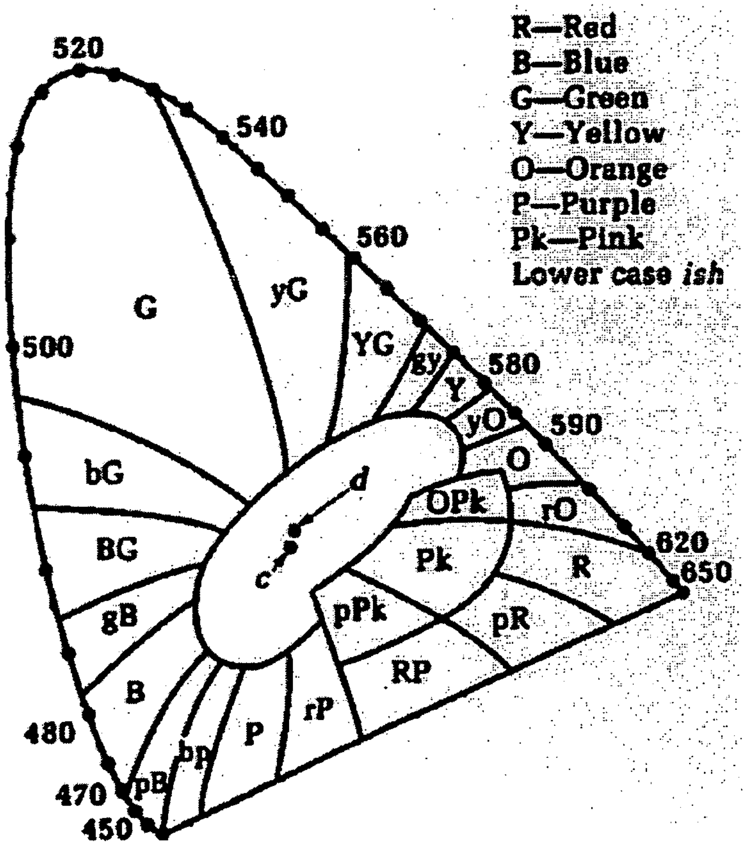
FIG. 6 illustrates a CIE color chart useful in the present invention.

FIG. 5*a*, the output of the alternating power source 501 as illustrated by FIG. 5*b* is firstly shifted by 90 degrees by a phase shifter 503 as shown in FIG. 5*c*. Both the AC output and the shifted power signals are applied to four LEDs 505, 507, 509, 511 through a plurality of rectifying diode 513, 515, 517, 519 such that the LEDs 505, 507, 509, 511 are alternately driven in the time domain as shown in FIG. 5*e*. It could be appreciated that the shifting the phase of the AC power signals by a predetermined degree may allow the single power source to alternately drive more LEDs in the time domain. It could also be understood that the phase shifting in the above described exemplary embodiment causes a delay in the time domain such that the peaks of the shifted signals do not overlap with the peaks of the original signals. Thereby, both the original and shifted power signals can be used to alternately drive different LEDs.

An ordinarily skilled person in the art would appreciate that the above-described embodiments may achieve lower energy consumptions by alternately driving more than one LEDs in the time domain. Further, these embodiments can be implemented at the packaging level, which could be relatively easier to implement. In addition, control of the color of the output light could be relatively easier and more stable.

Various alternatives can be made to the above-described embodiment.

For example, each LED can be coated with phosphor materials of a different color on its one side or both sides for reducing the mixing length.

Furthermore, at least one LED may emit light emissions of more than one wavelength, as an ordinarily skilled person in the art could generally appreciate. For example, an LED may emit both red and blue lights.

In addition, the LEDs can be stacked to reduce the mixing length by, for example, flip-chip technology or wire bonding process.

In wire bonding, suitable adhesives such as epoxy materials mixed with electrically and/or thermally conductive fillers or thermal stress relief type fillers are firstly used to bond the LEDs. Afterwards, wire bonding can be used to electrically connect the LEDs in series or parallel. Furthermore, phosphors can be added to the adhesives for absorption of the primary lights of the first and/or second LED or down conversion purpose.

In flip-chip process, solders such as SnPb, SnAgCu, SnZn, SnCu or conductive adhesives can be used to bond the bumps (not shown) of the LED chips/modules for both physical and electrical connections.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself. The definitions of the words or elements of the following claims are, therefore, defined in this specification to include not only the combination of elements which are literally set forth, but all equivalent structure, material or acts for performing substantially the same function in substantially the same way to obtain substantially the same result.

What is claimed is:

1. A light emitting device, comprising:

a first light emitting diode (LED) emitting a first light emission of at least a first wavelength, and a second light emitting diode emitting a second light emission of at least a second wavelength, the second LED being placed in close proximity to the first LED such that after a mixing length from the first and second LEDs, a combination of the first and second lights is perceived as one color in the human vision; and a power source which outputs a plurality of periodic discontinuous pulses for alternately driving the first and second LEDs in the time domain.

2. The light emitting device of claim 1, wherein the power source repeatedly and sequentially drives the first LED and the second LED.

3. The light emitting device of claim 1, wherein the first LED and the second LED are electrically connected in parallel.

4. The light emitting device of claim 1, wherein the pulses includes a first and a second set of pulses each set being of a first and second number of pulses within a predetermined period of time, and wherein the color perceived in the human vision can be determined and controlled by controlling a ratio of the first number to the second number.

5. The light emitting device of claim 1, wherein the pulses include a first and a second set of pulses, and wherein the color perceived in the human vision can be determined and controlled by controlling a ratio of the pulse width of the first set to the pulse width of the second set.

6. The light emitting device of claim 1, wherein the output of the power source drives at least one of the first LED and the second LED at a frequency of at least 20 Hz.

7. The light emitting device of claim 1, wherein the first and second wavelengths are different.

8. The light emitting device of claim 1, wherein the first and second wavelengths are the same, the device further comprising a phosphor materials coating on at least one of the first and second LEDs for generating a light of different wavelength.

9. The light emitting device of claim 1, further comprising a diffuser for diffusing at least one of the first and second lights so as to reduce the mixing length.

10. The light emitting device of claim 1, wherein at least one of the first and second LEDs is coated with a phosphor of a different color for reducing the mixing length.

11. The light emitting device of claim 1, wherein the one color perceived in the human vision is any desired color in the color spectrum.

12. The light emitting device of claim 1, wherein the one color perceived in the human vision is the color white.

13. The light emitting device of claim 1, wherein the first LED emitting a first light of a first wavelength is one of a first plurality of LEDs emitting a first light of a first wavelength; the second LED emitting a second light of a second wavelength is one of a second plurality of LEDs emitting a second light of a second wavelength; there being no other LED other than the first and second plurality of LEDs involved in generating the one color perceived in the human vision.

14. The light emitting device of claim 1, wherein the power source is an alternate current power source.

15. The light emitting device of claim 14, further comprising a rectifying circuit electrically connected between the power source and at least one of the first LED and the second LED.

16. The light emitting device of claim 1, further comprising a control mechanism for controlling at least a character of one of first LED and the second LED for altering the color perceived in the human vision.

17. The light emitting device of claim 16, wherein the control mechanism includes an adjustable resistor for controlling the voltage amplitude applied to the at least one of the first and second LEDs.

18. The light emitting device of claim 16, wherein the control mechanism includes means for controlling the frequency of the power signals applied to the at least one of the first and second LEDs.

19. The light emitting device of claim 1, further comprising a time delay mechanism in electrical connection with the power source for delaying the power signal by a predetermined period of time so as to drive at least a third LED.

20. The light emitting device of claim 19, wherein the time delay mechanism includes a phase shifter for shifting the phase of the power signal by a predetermined amount.

21. The light emitting device of claim 1, wherein the first and second LEDs are stacked for reducing the mixing length.

22. The light emitting device of claim 21, wherein the first and second LEDs are stacked by using flip-chip technology.

23. The light emitting device of claim 22, wherein the first and second LEDs are firstly adhered by using epoxy materials.

24. The light emitting device of claim 21, wherein the first and second LEDs are stacked by using a wire bonding process.

25. A light emitting device, comprising:

a first light emitting diode (LED) emitting blue light;

a second light emitting diode emitting amber light, the second light emitting diode being placed in close proximity to the first light emitting diode such that the combination of the blue and amber light form white light; and an alternate current power source which outputs a plurality of periodic discontinuous pulses for alternately, repeatedly and sequentially driving the first LED and the second LED in the time domain, wherein the pulses includes a first and a second set of pulses each set being of a first and second number of pulses within a predetermined period of time, and wherein the color perceived can be determined and controlled by controlling a ratio of the first number to the second number and/or by controlling a ratio of the pulse width of the first set to the pulse width of the second set.

26. The light emitting device of claim 25, wherein at least one of the first LED and the second LED has a phosphor materials coating for converting the emission of at least one of the first LED and the second LED.

* * * * *